(12) United States Patent
Knoedgen

(10) Patent No.: US 8,917,118 B2
(45) Date of Patent: Dec. 23, 2014

(54) BYPASS FOR ON-CHIP VOLTAGE REGULATOR

(71) Applicant: Dialog Semiconductor GmbH, Kircheim/Teck-Nabern (DE)

(72) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 13/660,165

(22) Filed: Oct. 25, 2012

(65) Prior Publication Data

US 2014/0028356 A1 Jan. 30, 2014

(30) Foreign Application Priority Data

Jul. 25, 2012 (EP) .................................... 12177779

(51) Int. Cl.
*H03K 3/00* (2006.01)
*H03K 19/00* (2006.01)
*H03K 17/16* (2006.01)

(52) U.S. Cl.
CPC ............ *H03K 19/0019* (2013.01); *H03K 17/16* (2013.01)
USPC .......................................... 327/108; 327/112

(58) Field of Classification Search
CPC .................... H03K 19/0019; H03K 19/00346; H03K 19/00369; H03K 17/16
See application file for complete search history.

(56) References Cited

U.S. PATENT DOCUMENTS

| | | | |
|---|---|---|---|
| 3,838,329 A | 9/1974 | Michelet et al. | |
| 4,562,559 A * | 12/1985 | Sharp et al. ..................... | 367/82 |
| 5,298,797 A * | 3/1994 | Redl .............................. | 327/387 |
| 5,497,311 A * | 3/1996 | Hanawaka .................. | 363/21.03 |
| 5,726,594 A * | 3/1998 | Williams ....................... | 327/108 |
| 5,748,461 A * | 5/1998 | Preller ............................ | 363/97 |
| 5,838,185 A * | 11/1998 | Dubhashi et al. .............. | 327/382 |
| 6,377,033 B2 * | 4/2002 | Hsu ................................. | 323/274 |
| 7,138,825 B2 * | 11/2006 | Kim et al. ........................ | 326/34 |
| 7,746,153 B1 * | 6/2010 | Megaw .......................... | 327/390 |
| 8,461,881 B2 * | 6/2013 | Park ............................... | 327/108 |
| 2008/0111611 A1 | 5/2008 | Thiele et al. | |
| 2008/0158918 A1 | 7/2008 | Hunter | |
| 2010/0097121 A1 * | 4/2010 | Laitinen ........................ | 327/513 |
| 2013/0049816 A1 * | 2/2013 | Cioci ............................. | 327/109 |

OTHER PUBLICATIONS

Power Supply Regulation, 1995-2014, Altera Corporation, http://www.altera.com/support/devices/power/regulators/pow-regulators.html, date accessed May 1, 2014.*
European Search Report 12177779.1-1239, mail date—Feb. 6, 2013.

* cited by examiner

*Primary Examiner* — Thomas J Hiltunen
(74) *Attorney, Agent, or Firm* — Saile Ackerman LLC; Stephen B. Ackerman

(57) ABSTRACT

The present document relates to a reduction of heat generated in driver circuits comprising voltage regulators. A circuit arrangement comprises a driver circuit configured to generate a control signal for driving a power switch. The driver circuit comprises a voltage regulator configured to generate a second voltage from a supply voltage, a drive unit configured to generate the control signal based on the supply voltage and configured to provide the control signal to a control interface of the driver circuit, and a logic component operating at the second voltage and drawing a second current, and configured to control the drive unit. Furthermore, the circuit arrangement comprises bypass circuitry coupled at an input to the control interface and configured to provide at an output at least part of the second current to the logic component.

26 Claims, 3 Drawing Sheets

BYPASS FOR ON-CHIP VOLTAGE REGULATOR

TECHNICAL FIELD

The present document relates to the reduction of heat generated within an integrated circuit. In particular, the present document relates to the reduction of heat generated in driver circuits comprising voltage regulators.

BACKGROUND

A driver circuit for controlling one or more external power switches (e.g. power transistors, such as Field Effect Transistors, FETs), typically comprises a voltage regulator in order to generate a low level logic voltage (e.g. at 3V) from a higher level supply voltage Vcc (e.g. at 12-15V). The logic voltage is typically used as a power supply for one or more logic components (e.g. a microcontroller) of the driver circuit. Furthermore, the driver circuit typically comprises one or more drive units for generating the gate control signals for the one or more external power switches, respectively. A gate control signal (which is applied to the gate of a corresponding power switch) may alternate between a high voltage (e.g. at the supply voltage Vcc) and a low voltage (e.g. at ground) at a commutation cycle rate and with a duty cycle (specifying the amount of time of high voltage within a commutation cycle), thereby operating the corresponding switch in an on/off mode (alternating between on-state and off-state).

During standby, when no gate control signals are generated by the driver circuit, the voltage regulator typically only provides a relatively low current, i.e. the driver circuit incurs only low losses (with little heat dissipation). On the other hand, during operation of the driver circuit, when one or more gate control signals are generated, the current through the voltage regulator may be significant (e.g. in the range of 10 mA). This results in a power loss and heat generation within the voltage regulator. The heat should to be dissipated e.g. using an additional heat sink on the driver circuit. However, the additional heat sink impacts the size and the cost of the driver circuit (in particular the package costs).

The present document addresses the above mentioned technical problems. In particular, the present document describes a driver circuit (and a corresponding method) which is configured to remove the need for an additional heat sink due to power losses incurred by a voltage regulator comprised within the driver circuit.

SUMMARY

A principal object of the present disclosure is to achieve an integrated circuit comprising a driver circuit, which is configured to remove the need for an additional heat sink due to power losses incurred by a voltage regulator comprised within the driver circuit.

Another principal object of the present disclosure is to achieve a method for a driver circuit, which is configured to remove the need for an additional heat sink due to power losses incurred by a voltage regulator comprised within the driver circuit.

A further objective of the present disclosure is to use the bypass circuitry to displace the power losses outside of the voltage regulator and outside of the driver circuit.

According to the objectives of the disclosure a circuit arrangement has been achieved. The circuit arrangement firstly comprises: a driver circuit configured to generate a control signal for driving a power switch; wherein the driver circuit comprises a voltage regulator configured to generate a second voltage from a supply voltage, a drive unit configured to generate the control signal based on the supply voltage and configured to provide the control signal to a control interface of the driver circuit, and a logic component operating at the second voltage and drawing a second current, and configured to control the drive unit. Furthermore the circuit arrangement comprises a bypass circuitry coupled at an input to the control interface and configured to provide at an output at least part of the second current to the logic component.

According to the objectives of the disclosure a method to reduce heat generated within a driver circuit used to drive an external power switch has been achieved. The method disclosed comprising: providing a driver circuit comprising a voltage regulator, a drive unit, and logic components configured to control the drive unit, an external power switch driven by the driver circuit, a supply voltage, and a bypass circuitry, generating by the driver circuit a control signal for driving the power switch, implementing the bypass circuitry comprising a resistor, wherein the bypass circuitry is external to the driver circuit, and splitting power losses between the voltage regulator and the bypass resistor, wherein a sum of the power losses remains unchanged by the splitting.

According to an aspect, a circuit arrangement comprising a driver circuit and bypass circuitry is described. The driver circuit may be configured to generate a control signal for driving a power switch. The bypass circuitry may be configured to offload power dissipation from the driver circuit to the bypass circuitry, wherein the bypass circuitry is typically external to the driver circuit. As a result, heat dissipation can be ensured in a cost-efficient manner. The circuit arrangement may e.g. be part of a switched-mode power converter comprising the power switch. Alternatively or in addition, the circuit arrangement may be used within a driver for a Solid State Lighting (SSL) device, such as an array of LEDs (Light Emitting Diodes) or OLEDs (Organic LEDs).

The driver circuit may comprise a voltage regulator configured to generate a second voltage from a supply voltage. The second voltage may be smaller (or lower) than the supply voltage. In particular the magnitude of the second voltage may be smaller than the magnitude of the supply voltage. By way of example, the second voltage may be a logic voltage e.g. for a logic component of the driver circuit. Typically, a voltage regulator receives the supply voltage at its input and provides the second (e.g. the logic) voltage at its output. As such, the output may be coupled to one or more logic components within the driver circuit, wherein the one or more logic components operate at the second voltage (e.g. the logic voltage). In other words, the output of the voltage regulator may be used as a power supply for the one or more logic components comprised within the driver circuit. Typical examples for the supply voltage are in the range of 12 to 15V and/or typical examples for the second voltage (e.g. the logic voltage) are in the range of 1-5V (e.g. at 1.5V for logic components and/or at 3V or 5V for analog components).

The voltage regulator may e.g. be a linear regulator. In particular, the voltage regulator may comprise a transistor operated in its linear region. Such voltage regulators may be advantageous for the integration into the driver circuit, e.g. for the integration into the integrated circuit comprising the driver circuit. On the other hand, voltage regulators (and in particular linear voltage regulators) may exhibit relatively high power losses due to the voltage drop across the voltage regulator and due to current drawn at the output of the voltage regulator (e.g. by the one or more logic components). Such power losses lead to heat which needs to be dissipated (e.g. using additional heat sinks within the driver circuit). In the present document, it is proposed to use the bypass circuitry to displace the power losses outside of the voltage regulator and outside of the driver circuit.

The driver circuit may comprise a drive unit configured to generate the control signal for the (external) power switch based on the supply voltage (and based on ground). The control signal may comprise a high voltage signal (e.g. at the supply voltage) and/or a low voltage signal (e.g. at ground). In other words, the control signal may be at a high voltage, wherein the high voltage may correspond to or may be derived from the supply voltage. At other time instants, the control signal may be at a low voltage, wherein the low voltage may correspond to ground. By way of example, the control signal may alternate between the high voltage and the low voltage at a communication cycle rate and with a duty cycle.

The drive unit may be coupled to a control interface of the driver circuit and thereby provide the control signal to the control interface. The control interface may e.g. be a pin of the driver circuit. The (external) power switch may be coupled to the control interface.

Furthermore, the driver circuit may comprise a (e.g. one or more) logic component and/or an analog component operating at the second voltage (e.g. a logic voltage) and drawing a second current (e.g. a logic current). The logic component may be configured to control the drive unit. By way of example, the logic component may be configured to set the commutation cycle length and the duty cycle of the control signal generated by the drive unit.

In addition, the circuit arrangement comprises bypass circuitry which is coupled at an input of the bypass circuitry to the control interface. The bypass circuitry may be configured to provide at an output of the bypass circuitry at least part of the second current to the logic component. In particular, the bypass circuitry may be configured to draw current from the drive unit (via the control interface) and provide the current to the logic component. As such, the bypass circuitry may be configured to reduce the current which is to be provided by the voltage regulator, thereby reducing the power losses (and the heat) generated within the voltage regulator.

The circuit arrangement may further comprise a capacitor interface (e.g. a pin) which is coupled to the output of the voltage regulator. Hence, the capacitor interface is coupled to the second voltage provided by the voltage regulator. The output of the bypass circuitry may be coupled to the capacitor interface. As such, the current provided at the output of the bypass circuitry may be used to reduce the current which is to be provided by the voltage regulator in order to supply power to the logic component. In particular, the logic component may also be coupled to the capacitor interface. The second current may then correspond to the sum of the current at the output of the voltage regulator and the current provided at the output of the bypass circuitry.

The circuit arrangement may further comprise a stabilizing capacitor coupled to the capacitor interface. The stabilizing capacitor may be used to stabilize the second voltage provided by the voltage regulator. The stabilizing capacitor may be external to the driver circuit.

The bypass circuitry may comprise a bypass resistor. The current through the bypass resistor may correspond to the current provided at the output of the bypass circuitry. The current through the bypass resistor depends on the resistance of the bypass resistor and the voltage drop across the bypass resistor. As such, the resistance of the bypass resistor may be selected such that the current provided at the output of the bypass circuitry corresponds at least to the second current. Furthermore, the bypass circuitry may comprise a bypass diode configured to block a current from the output of the bypass circuitry to the input of the bypass circuitry. As such, it can be ensured that there is no reverse current flowing from the capacitor interface to the control interface. Such reverse current would lead to additional power losses within the voltage regulator.

The driver circuit may comprise a plurality of drive units configured to generate a plurality of control signals for a plurality of power switches, respectively. Furthermore, the plurality of drive units may be configured to provide the plurality of control signals to a plurality of control interfaces of the driver circuit, respectively. The plurality of (external) power switches may be coupled to the plurality of control interfaces, respectively. The plurality of power switches may e.g. form a half-bridge or a full-bridge.

The circuit arrangement may comprise a plurality of bypass circuitries, each coupled at an input to a respective control interface and each configured to provide at an output a respective current. The currents provided at the outputs of the plurality of bypass circuitries may be used to provide at least part of the second current to the logic component. For this purpose, the outputs of the plurality of bypass circuitries may be coupled to the capacitor interface.

As indicated above, at least some of the plurality of control signals may be alternating between a high voltage and a low voltage. The driver circuit may be configured to generate the plurality of control signals such that when at least one of the plurality of control signals is at high voltage, at least another of the plurality of control signals is at low voltage. In other words, at least some of the plurality of control signals may have opposite phases. The plurality of bypass circuitries may be designed such that a sum of the currents provided at the outputs of the plurality of bypass circuitries is substantially constant. In other words, the plurality of bypass circuitries may be designed such that a sum of the currents provided at the outputs of the plurality of bypass circuitries lies within a pre-determined current interval for all time instants within a time interval (e.g. as long as the at least some of the plurality of control signals are alternating between a high voltage and a low voltage, or as long as the driver circuit is operating). As such, it can be ensured that a continuous current is provided to the logic component, thereby offloading the voltage regulator.

As indicated above, the driver circuit may be part of an integrated circuit, e.g. an integrated circuit using CMOS technology. The bypass circuitry may be external to the integrated circuit. Furthermore, the power switch and/or the stabilizing capacitor may be external to the integrated circuit.

The driver circuit may further comprise a supply interface (e.g. a pin) configured to receive the supply voltage from a power supply external to the driver circuit. Furthermore, it should be noted that the voltage regulator may be configured to sink current. In particular, the voltage regulator may be configured to sink excess current provided at the output of the bypass circuitry, e.g. excess current which exceeds the second current drawn by the logic component.

According to a further aspect, a system comprising the above mentioned circuit arrangement is described. The circuit arrangement may be configured to generate one or more control signals. In addition, the system comprises one or more power switches controlled using the respective one or more control signals. The one or more power switches may form a half-bridge or a full-bridge. The one or more power switches may be field effect transistors.

It should be noted that the methods and systems including its preferred embodiments as outlined in the present document may be used stand-alone or in combination with the other methods and systems disclosed in this document. In addition, the features described in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

In the accompanying drawings forming a material part of this description, there is shown.

DETAILED DESCRIPTION OF THE DISCLOSURE

Figure 1:
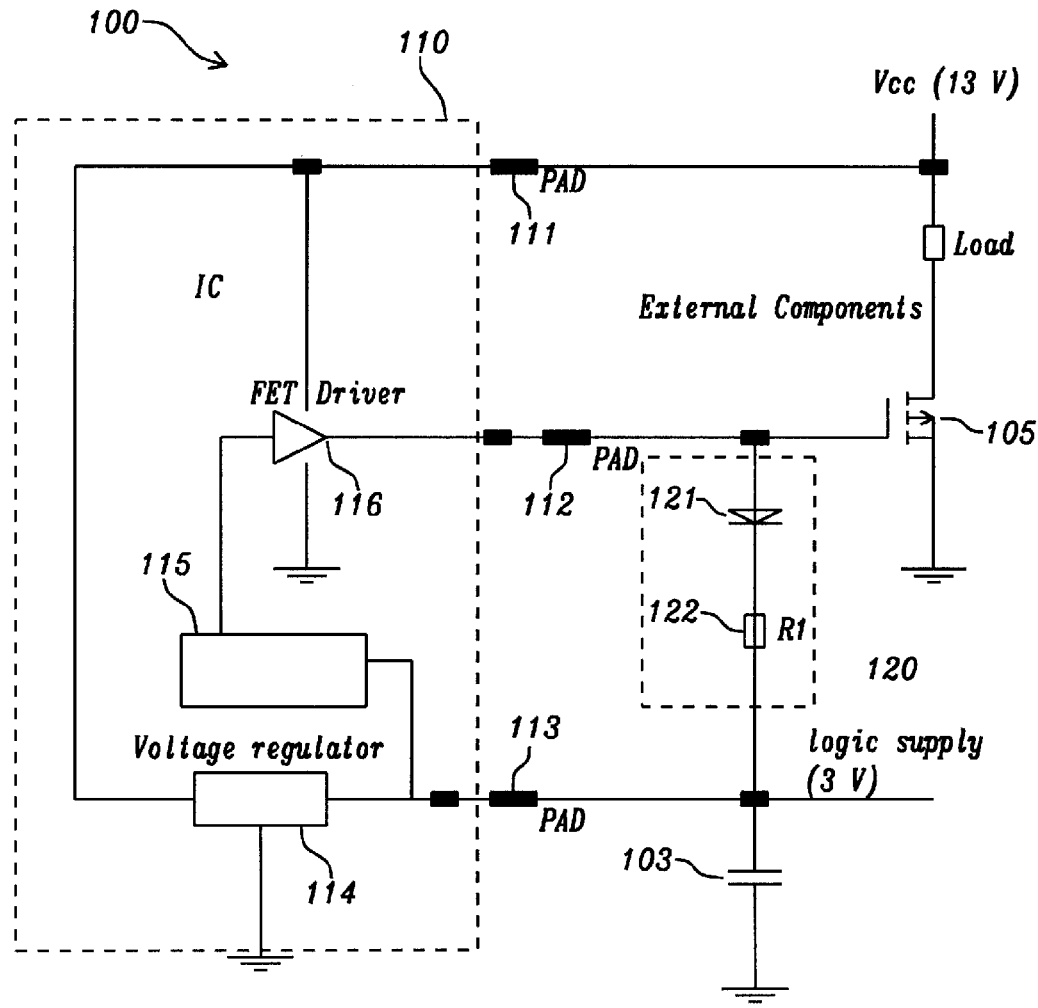
FIG. 1 illustrates a block diagram of an example system configured to drive an external power switch.

As outlined in the introductory section, the present document addresses the technical problem of reducing the heat generated within a driver circuit used to drive an external power switch. FIG. 1 illustrates a block diagram of an example system 100 comprising a driver circuit 110 and an external power switch 105. The driver circuit 110 comprises a drive unit 116 which is configured to generate the gate control signal (e.g. a gate voltage) for the power switch 105. The gate of the power switch 105 is coupled to the drive unit 116 via the control interface 112 of the driver circuit 110. The drive unit 116 may be configured to generate a gate control signal which alternates between a high voltage (e.g. at the supply voltage Vcc) and a low voltage (e.g. at ground). For this purpose, the drive unit 116 may comprise a control switch (e.g. a transistor) which couples the gate of the power switch 105 (i.e. which couples the control interface 112) to the supply voltage Vcc, e.g. when in off-state, and which couples the gate of the power switch 105 (i.e. which couples the control interface 112) to ground, e.g. when in on-state (or vice versa).

Furthermore, the driver circuit 110 comprises one or more logic components 115 which operate using a logic voltage. The one or more logic components 115 may e.g. comprise a microcontroller. The logic voltage (typically a DC voltage) is typically smaller than the supply voltage Vcc (typically a DC voltage). In particular, the absolute value of the logic voltage is typically smaller than the absolute value of the supply voltage Vcc. In the illustrated example, the logic voltage is at 3V and the supply voltage Vcc is at 13V. The driver circuit 110 may comprise a supply interface 111 configured to receive the supply voltage.

The driver circuit 110 comprises a voltage regulator 114 which is configured to generate the logic voltage from the supply voltage Vcc. The voltage regulator 114 may comprise an active regulator and/or a passive regulator. In particular, the voltage regulator 114 may comprise a linear regulator. A linear regulator may comprise a transistor which is operated in its linear region. Linear regulators are advantageous as they provide a DC output voltage (the logic voltage) from a DC input voltage (the supply voltage Vcc) with little noise. Furthermore, linear regulators are cost-effective and allow for a high integration into the integrated circuit comprising the driver circuit 110. On the other hand, linear regulators may have a relatively low power efficiency (compared e.g. to switched-mode power converters). As such, the voltage regulator 114 (notably a linear voltage regulator) may incur relatively high power losses.

The driver circuit 110 may further comprise a capacitor interface 113 configured to couple the output port of the voltage regulator 114 to an external stabilizing capacitor 103.

The system 100 of FIG. 1 further comprises a load 104. It should be noted that the load 104 may be coupled to a voltage which is different to the supply voltage Vcc (i.e. different to what is shown in FIG. 1). By way of example, the load 104 may be coupled to a mains voltage or a voltage derived from the mains voltage. Furthermore, it should be noted that the external power switch 105 may be operated in various systems, e.g. within a switched-mode power supply, within a half-bridge and/or within a full-bridge. The driver circuit 110 may comprise a plurality of drive units 116 for generating gate control signals for a corresponding plurality of external power switches 105.

As indicated above, the voltage regulator 114 provides the logic voltage from the supply voltage Vcc. As a consequence, there may be voltage drop across the voltage regulator 114, which corresponds to a difference between the supply voltage Vcc and the logic voltage. In the illustrated example, the voltage drop across the voltage regulator 114 may be 13V−3V=10V. Furthermore, during operation, there is typically a current flow into the one or more logic components 115 of the driver circuit 110. The current flow is usually provided by (i.e. the current flow typically traverses the) voltage regulator 114. As a result of the voltage drop across the voltage regulator 114 and the current flow through the voltage regulator 114, there is a power loss at the voltage regulator 114. The power loss at the voltage regulator 114 typically corresponds to the product of the voltage drop and the current flow (e.g. 10V*100 mA=1W). The power loss at the voltage regulator 114 leads to heat within the driver circuit 110 which needs to be dissipated. This may be achieved by using an additional heat sink on the driver circuit 110. This, however, increases the cost and the size of the driver circuit 110.

In the present document, additional circuitry 120 is described (referred to herein as bypass circuitry 120), which may be used to move the generation of power losses (and consequently the generation of heat) outside of the driver circuit 110, thereby removing the need for an additional heat sink within the driver circuit 110. Heat which is generated at bypass circuitry 120 which lies outside of the integrated circuit comprising the driver circuit 110 can be dissipated in a more efficient manner than heat which is generated within the integrated circuit. Hence, the use of bypass circuitry 120 which is external to the driver circuit 110 leads to a more cost efficient overall system 100 comprising the driver circuit 110, the external power switch 105 and the bypass circuitry 120 (compared to a system 100 which does not comprise the bypass circuitry 120).

The bypass circuitry 120 of FIG. 1 comprises a bypass resistor 122 which couples the control interface 112 to the capacitor interface 113. When the gate control signal at the control interface 112 corresponds to the high voltage (e.g. to the supply voltage Vcc), the voltage at the bypass resistor 122 may be determined based on the difference of the supply voltage Vcc and the logic voltage. The current through the bypass resistor 122 depends on the voltage at the bypass resistor 122 and on the resistance R1 of the bypass resistor 122. By way of example, the voltage at the bypass resistor 122 may be 10V and the resistance R1 may be 100Ω, such that the current through the bypass resistor 122 is 100 mA.

The current through the bypass resistor 122 flows to the capacitor interface 113 and thereby contributes to the current drawn by the one or more logic components 115 of the driver circuit 110. As such, the current which needs to be provided by the voltage regulator 114 is reduced, thereby reducing the power losses (and the heat) incurred at the voltage regulator 114. On the other hand, power losses are incurred at (the bypass resistor 122 within) the bypass circuitry 120. However, this power loss and this heat are generated outside of the driver circuit 110, and the generated heat can therefore be dissipated in a more efficient manner. The power losses typically remain unchanged, but the power losses are split between the voltage regulator 114 and the bypass resistor 122.

It should be noted that the current through the bypass resistor 122 may be provided by the drive unit 116 with negligible power loss. This is due to the fact that the voltage drop across the drive unit 116 is relatively small compared to the voltage drop across the voltage regulator 114.

The drive unit 116 may generate a gate control signal at low voltage (e.g. at ground). In this case, there would be a reverse voltage drop at the bypass resistor 122 (e.g. a reverse voltage of 0V−3V=−3V). This reverse voltage drop would lead to a reverse current through the bypass resistor 122, wherein the reverse current would add to the current that needs to be provided by the voltage regulator 114 (thereby further increasing the power loss and the heat generated at the voltage regulator 114). For this purpose, the bypass circuitry 120 may comprise a bypass diode 121, wherein the bypass diode 121 is configured to block a current flow through the bypass circuitry 120 from the capacitor interface 113 to the control interface 112. As such, the bypass diode 121 may be configured to limit the power loss within the voltage regulator 114 and within the bypass circuitry 120, when the drive unit 116 generates a low voltage gate control signal.

It should be noted that when the drive unit 116 generates a low voltage gate control signal, the current flow within the one or more logic components 115 is typically lower than when the drive unit 116 generates a high voltage gate control signal.

Overall, it is noted that in systems 100, e.g. electronic load systems or automotive electronic systems, which are in standby, no alternating gate control signal is generated for the external power switch 105. Typically, the gate control signal is at low voltage in such standby phases. In such standby phases, the current of the integrated circuit (IC) comprising the driver circuit 110, in particular the current drawn by the one or more logic components 115, is typically very low (e.g. some 10th of μA). If the system 100 starts operation, the external power switch 105 (or the plurality of external power switches 105) is clocked by the drive unit 116 (or by the respective plurality of drive units 116) using the gate control signal (or the plurality of gate control signals). As a result, the IC comprising the driver circuit 110 takes a high amount of current, notably at the on-chip voltage regulator 114. The voltage drop at the drive unit 116 is typically very low (e.g. several 10 mV) compared to the voltage drop at the voltage regulator 114 (e.g. several volts). The bypass circuitry 120 of FIG. 1 bypasses a part or all of the current within the driver circuit 110 by low cost external components, without using an external voltage regulator. The effect is significantly reduced power dissipation on-chip, such that the thermal requirements with respect to the IC package are relaxed.

Hence, when the drive unit 116 (comprising e.g. a driver switch) switches to high (e.g. to the high voltage), a current flows via the bypass diode 121 and the bypass resistor 122. This current takes over (entirely or partially) the current in the voltage regulator 114. As indicated above, the voltage drop in the drive unit 116 is relatively low and consequently the power is dissipated in the bypass diode 121 and the bypass resistor 122 (i.e. in the bypass circuitry 120).

The bypass circuitry 120 (notably the bypass resistor 122) may be designed such that under certain operational conditions of the system 100, the current through the bypass circuitry 120 exceeds the current drawn by the one or more logic components 115 of the driver circuit 110. In order to cope with such a situation, the voltage regulator 114 may be configured to sink current (in addition to source current). The combination of driver circuit 110 and bypass circuitry 120 is referred to as circuit arrangement in the present document.

Figure 2:
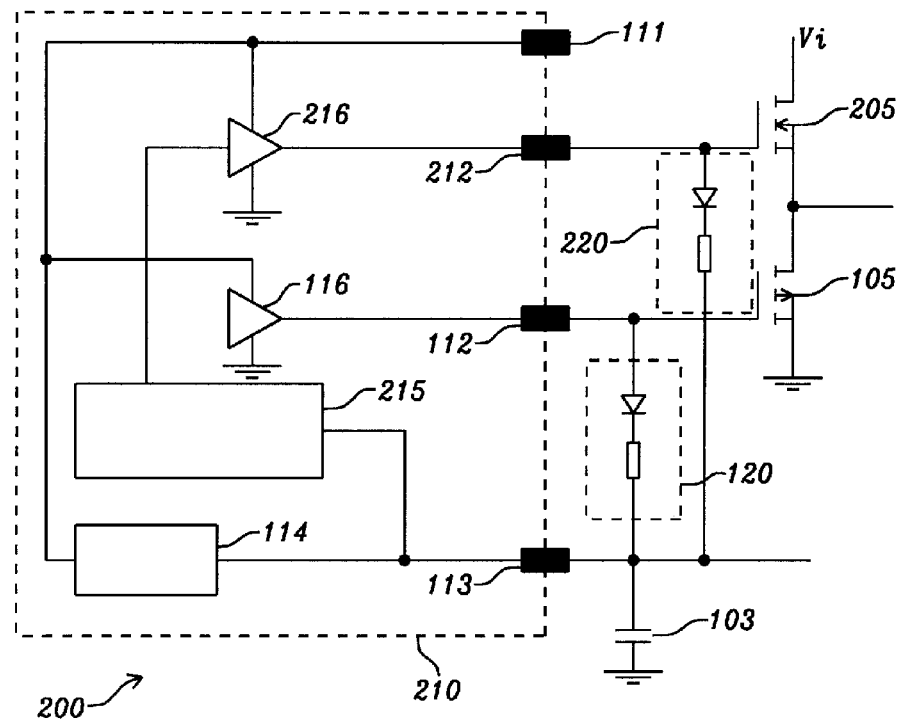
FIG. 2 shows a block diagram of an example system comprising a plurality of power switches.

The bypass circuitry 120 may be used in conjunction with a driver circuit 110 which is configured to generate a plurality of gate control signals for a plurality of power switches 105. FIG. 2 illustrates an example block diagram of a system 200 comprising a half-bridge with the power switches 105, 205 (the high side switch 205 being coupled to an input voltage Vi, e.g. the mains voltage, and the low side switch 105 being coupled to ground). Furthermore, the system 200 comprises a driver circuit 210 with a plurality of corresponding drive units 116, 216 for the plurality of power switches 105, 205 of the half-bridge, respectively. In a similar manner to the driver circuit 110 of FIG. 1, the driver circuit 210 comprises a supply interface 111 (for receiving the supply voltage Vcc), a plurality of control interfaces 112, 212 (for providing the gate control signals to the respective power switches 105, 205) and a capacitor interface 113 (for coupling a stabilizing capacitor 103 to the voltage regulator 114 of the driver circuit 210). In addition, the driver circuit 210 comprises one or more logic components 215 which are configured to control the plurality of drive units 116, 216.

Furthermore, the system 200 comprises a plurality of bypass circuitries 120, for the plurality of power switches 105, 205, respectively. The bypass circuitries 120, 220 may comprise respective bypass diodes 121 and/or bypass resistors 122. Upon generation of a high voltage gate control signal, a bypass circuitry 120, 220 provides a current to the capacitor interface 113. The current provided by the plurality of bypass circuitries 120, 220 contributes to the current drawn by the one or more logic components 215 of the driver circuit 210, thereby reducing the current which is to be provided by the voltage regulator 114.

Figure 3:
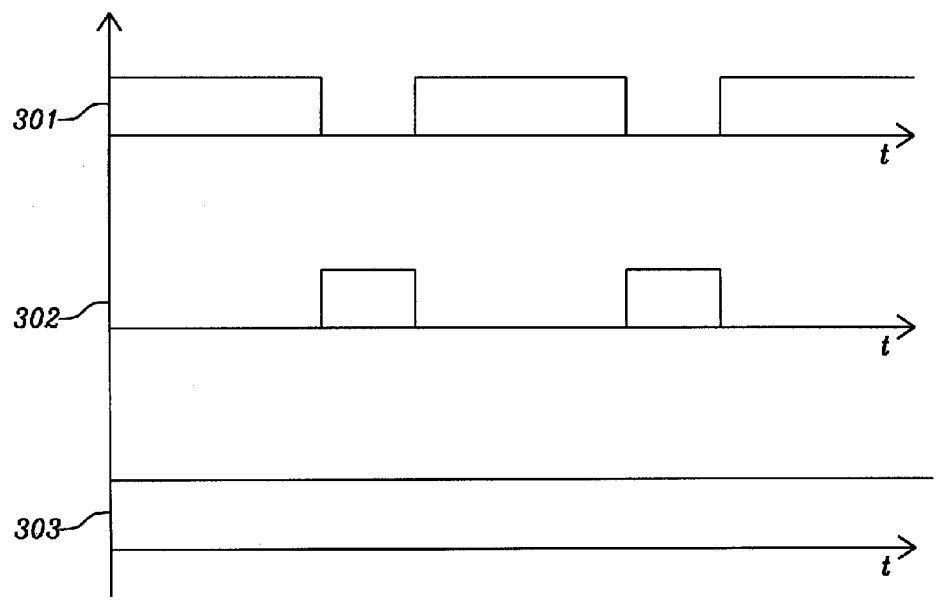
FIG. 3 illustrates example currents provided by a plurality of bypass circuitries.

FIG. 3 shows example currents provided by the bypass circuitries 120, 220 of system 200, when the two power switches 105, 205 alternate between on-state and off-state at a commutation cycle rate with opposite phase. It can be seen that when a high voltage gate control signal is generated for the first power switch 105 (and a low voltage gate control signal is generated for the second power switch 205), the first bypass circuitry 120 provides a current 301 (and the second bypass circuitry 220 provides no current). In a similar manner, when a high voltage gate control signal is generated for the second power switch 205 (and a low voltage gate control signal is generated for the first power switch 105), the second bypass circuitry 220 provide a current 302 (and the first bypass circuitry 120 provides no current). It can be seen that by appropriately designing the first and second bypass circuitries 120, 220, it can be achieved that the overall current 303 provided by the first and second bypass circuitries 120, 220 at the capacitor interface 113 is constant or flat. As such, the plurality of bypass circuitries 120, 220 may provide a constant current to the one or more logic components 215. The plurality of bypass circuitries 120, 220 may be designed such that the current provided by the plurality of bypass circuitries 120, 220 corresponds (partly or completely) to the current drawn by the one or more logic components 215 of the driver circuit 210, thereby reducing or removing the current through the voltage regulator 114.

Overall, it should be noted that the bypass circuitries 120, 220 can be used in conjunction with a half bridge, a full bridge and/or in conjunction with power switches 105, 205 which are not clocked but which receive a static high voltage gate control signal. As already indicated, a benefit of using the bypass circuitries 120, 220 is that less power is dissipated within the IC package comprising the driver circuit 210.

In the present document, bypass circuitry has been described which may be used to reduce the power losses incurred within an integrated circuit comprising a driver circuit for one or more external power switches. The bypass circuitry allows dislocating the power losses typically incurred within the voltage regulator of the driver circuit outside of the driver circuit, in a cost-efficient manner. As a result, the thermal constraints of the integrated circuit may be relaxed.

Figure 4:
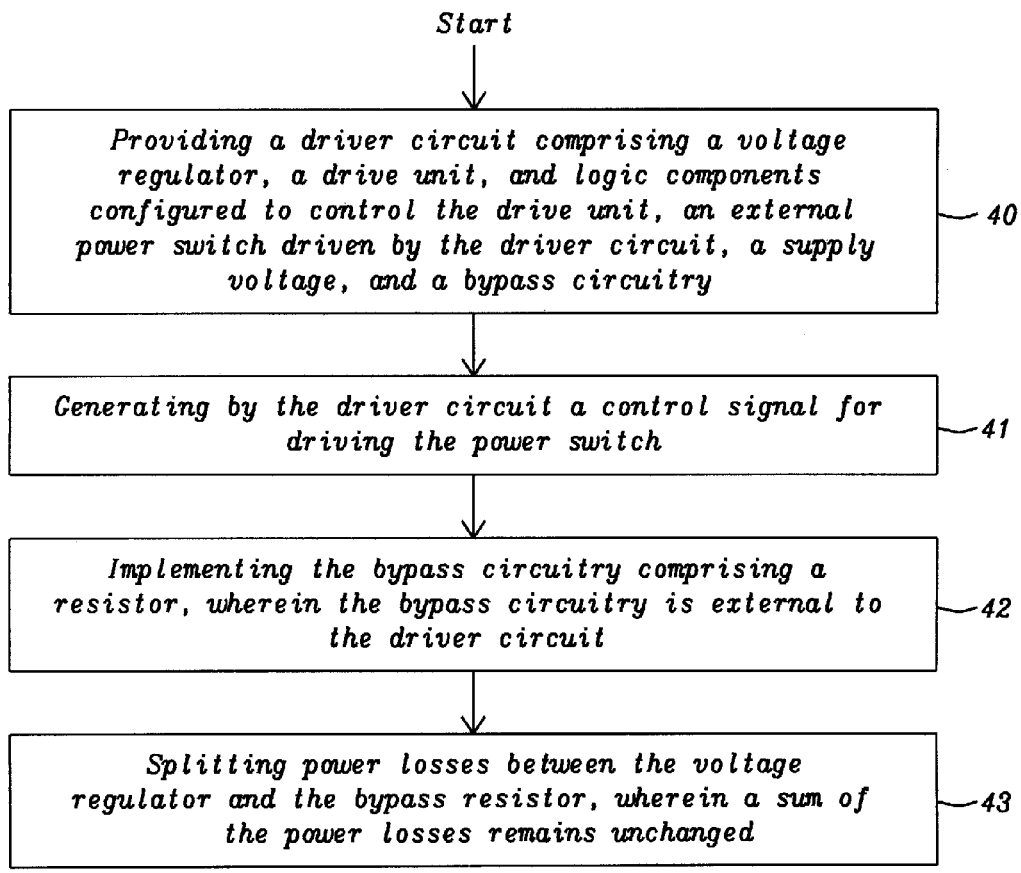
FIG. 4 illustrates a flowchart of a method to reduce the heat generated within a driver circuit used to drive an external power switch

FIG. 4 illustrates a flowchart of a method to reduce the heat generated within a driver circuit used to drive an external power switch. A first step 40 describes the provision of a driver circuit comprising a voltage regulator, a drive unit, and logic components configured to control the drive unit, an external power switch driven by the driver circuit, a supply voltage, and a bypass circuitry. Step 41 illustrates generating by the driver circuit a control signal for driving the power switch. Step 42 shows implementing the bypass circuitry comprising a resistor, wherein the bypass circuitry is external to the driver circuit. Step 43 depicts splitting power losses between the voltage regulator and the bypass resistor, wherein a sum of the power losses remains unchanged by the splitting.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A circuit arrangement comprising
a driver circuit configured to generate a control signal at a high voltage and at a low voltage for driving a power switch; wherein the driver circuit comprises
a voltage regulator configured to generate a second voltage from a supply voltage;
a drive unit configured to generate the control signal based on the supply voltage and configured to provide the control signal to a control interface of the driver circuit; and
a logic component operating at the second voltage and drawing a second current, and configured to control the drive unit; and
a bypass circuitry coupled at an input to the control interface and configured to provide at an output at least part of the second current to the logic component, when the control signal is at high voltage;
wherein
the driver circuit comprises a plurality of drive units configured to generate a plurality of control signals for a plurality of power switches, respectively, and configured to provide the plurality of control signals to a plurality of control interfaces of the driver circuit, respectively; and
the circuit arrangement comprises a plurality of bypass circuitries, each coupled at an input to a respective control interface and each configured to provide at an output at least part of the second current to the logic component.

2. The circuit arrangement of claim 1, wherein
the circuit arrangement further comprises a capacitor interface coupled to an output of the voltage regulator providing the second voltage;
the output of the bypass circuitry is coupled to the capacitor interface.

3. The circuit arrangement of claim 2, wherein the circuit arrangement further comprises a stabilizing capacitor coupled to the capacitor interface.

4. The circuit arrangement of claim 2, wherein the logic component is coupled to the capacitor interface.

5. The circuit arrangement of claim 1, wherein the control signal comprises
a high voltage signal at the supply voltage; and/or
a low voltage signal at ground.

6. The circuit arrangement of claim 1, wherein the bypass circuitry comprises
a bypass resistor; and/or
a bypass diode configured to block a current from the output of the bypass circuitry to the input of the bypass circuitry.

7. The circuit arrangement of claim 1, wherein
at least some of the plurality of control signals are alternating between a high voltage and a low voltage;
the plurality of control signals are such that when at least one of the plurality of control signals is at high voltage, at least another of the plurality of control signals is at low voltage; and
the plurality of bypass circuitries are designed such that a sum of the currents provided at the outputs of the plurality of bypass circuitries is substantially constant.

8. The circuit arrangement of claim 1, wherein
the driver circuit is part of an integrated circuit; and/or
the bypass circuitry is external to the integrated circuit; and/or
the power switch is external to the integrated circuit.

9. The circuit arrangement of claim 8, wherein the circuit is an integrated circuit using CMOS technology.

10. The circuit arrangement of claim 1, wherein
the voltage regulator is a linear regulator; and/or
the voltage regulator comprises a transistor operated in its linear region.

11. The circuit arrangement of claim 1, wherein
the supply voltage is in the range of 12 to 15V; and/or
the second voltage is in the range of 1-5V.

12. The circuit arrangement of claim 1, wherein the driver circuit further comprises a supply interface configured to receive the supply voltage from a power supply external to the driver circuit.

13. The circuit arrangement of claim 1, wherein the voltage regulator is configured to sink current provided at the output of the bypass circuitry, which exceeds the second current.

14. The circuit arrangement of claim 1, wherein the circuit arrangement is configured to generate one or more control signals.

15. The circuit arrangement of claim 14, wherein one or more power switches are controlled using the respective one or more control signals, wherein the one or more power switches form a half-bridge or a full-bridge.

16. The circuit arrangement of claim 15, wherein the one or more power switches are field effect transistors.

17. A method to reduce heat generated within a driver circuit used to drive an external power switch, the method comprising
providing a driver circuit comprising a voltage regulator, a drive unit, and logic components configured to control the drive unit, an external power switch driven by the driver circuit, a supply voltage, and a bypass circuitry;
generating by the driver circuit a control signal at a high voltage and at a low voltage for driving the power switch;
implementing the bypass circuitry comprising a resistor, wherein the bypass circuitry is external to the driver circuit;
splitting power losses between the voltage regulator and the bypass resistor, by providing current to the logic components using the bypass circuitry, when the control signal is at high voltage, wherein a sum of the power losses remains unchanged by the splitting; and
generating a plurality of control signals respectively for a plurality of power switches via a plurality of control interfaces by a plurality of drive units, wherein a plurality of bypass circuitries, each coupled at an input to a respective control interface, and each provides at an output at least part of a second current to the logic component.

18. The method of claim 17 wherein the drive unit generates the control signal based on the supply voltage and provides the control signal to a control interface of the driver circuit.

19. The method of claim 18 further comprises generating a second voltage from the supply voltage by the voltage generator.

20. The method of claim 19 further comprises controlling the drive unit by the logic component, wherein the logic components is operating at the second voltage and is drawing a second current.

21. The method of claim 20, further comprises providing at least a part of the second current to the logic component by the bypass circuitry via a control interface.

22. The method of claim 21 further comprises providing the second voltage via a capacitor interface coupled to an output of the voltage regulator output voltage wherein the output of the bypass circuitry is coupled to the capacitor interface.

23. The method of claim 17, wherein the control signal comprises a high voltage signal at the supply voltage and/or a low voltage signal at ground.

24. The method of claim 17 further comprises blocking a current from an output of the bypass circuitry to an input of the bypass circuitry by a diode.

25. The method of claim 17, wherein at least some of the plurality of control signals are alternating between a high voltage and a low voltage and wherein the plurality of control signals are such that when at least one of the plurality of control signals is at high voltage, at least another of the plurality of control signals is at low voltage, and the plurality of bypass circuitries are designed such that a sum of the currents provided at the outputs of the plurality of bypass circuitries is substantially constant.

26. The method of claim 17, wherein the driver circuit is part of an integrated circuit and the bypass circuitry and the power switch are external to the integrated circuit.

* * * * *

UNITED STATES PATENT AND TRADEMARK OFFICE
CERTIFICATE OF CORRECTION

| | | |
|---|---|---|
| PATENT NO. | : 8,917,118 B2 | Page 1 of 1 |
| APPLICATION NO. | : 13/660165 | |
| DATED | : December 23, 2014 | |
| INVENTOR(S) | : Horst Knoedgen | |

It is certified that error appears in the above-identified patent and that said Letters Patent is hereby corrected as shown below:

On the Title Page

In the Applicant (71), delete address "Kircheim/Teck-Nabern (DE)" and replace with -- Kirchheim/Teck-Nabern (DE) --.

Signed and Sealed this
Fifth Day of May, 2015

Michelle K. Lee
*Director of the United States Patent and Trademark Office*